(12) United States Patent
Mullarkey

(10) Patent No.: US 6,351,141 B2
(45) Date of Patent: Feb. 26, 2002

(54) METHOD AND APPARATUS FOR LIMITED REPROGRAMMABILITY OF FUSE OPTIONS USING ONE-TIME PROGRAMMABLE ELEMENTS

(75) Inventor: Patrick J. Mullarkey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/882,516

(22) Filed: Jun. 15, 2001

Related U.S. Application Data

(62) Division of application No. 09/379,658, filed on Aug. 24, 1999.

(51) Int. Cl.[7] ............................. G06F 7/38; G11C 8/00; H01H 37/76
(52) U.S. Cl. .......................... 326/38; 326/105; 327/525
(58) Field of Search ................................. 326/105–108, 326/38, 47; 327/525

(56) References Cited

U.S. PATENT DOCUMENTS

| | | | | |
|---|---|---|---|---|
| 4,721,868 A | * | 1/1988 | Cornell et al. ............... | 326/38 |
| 5,153,458 A | * | 10/1992 | Hinooka ...................... | 326/38 |
| 5,446,402 A | * | 8/1995 | Yoshimori ................... | 326/108 |

FOREIGN PATENT DOCUMENTS

JP  403050850 A  *  3/1991  .................. 326/38

* cited by examiner

*Primary Examiner*—Michael Tokar
*Assistant Examiner*—Daniel D. Chang
(74) *Attorney, Agent, or Firm*—Hugh R. Kress; Winstead Sechrest & Minick P.C.

(57) ABSTRACT

A method and apparatus for limited reprogrammability of fuse options in a semiconductor device is disclosed. In one embodiment, option circuitry includes a plurality of programmable devices each actuable from a first state to a second state and an option circuitry, which is coupled to the plurality of programmable devices to receive a plurality of logic signals reflecting the respective states of the plurality of programmable devices. The option circuitry is responsive to the plurality of logic signals to assert a particular one of a plurality of distinct option signals. The particular option signal is determined based on the particular combination of respective states of the plurality of programmable devices. The semiconductor device is responsive to assertion of each of the plurality of distinct option signals to operate in a distinct one of at least two operational modes. The option circuitry is responsive to at least two distinct combinations of respective states of the plurality of programmable devices to assert the same option signal, such that the semiconductor device can be programmed to operate first in a first of the at least two operational modes, then in a second of the at least two operational modes, and then again in the first of the at least two operational modes.

18 Claims, 2 Drawing Sheets

METHOD AND APPARATUS FOR LIMITED REPROGRAMMABILITY OF FUSE OPTIONS USING ONE-TIME PROGRAMMABLE ELEMENTS

CROSS-REFERENCE TO RELATED APPLICATIONS

This is a divisional of prior co-pending application Ser. No. 09/379,658 filed on Aug. 24, 1999.

FIELD OF THE INVENTION

The present invention relates generally to semiconductor devices, and more particularly to a method and apparatus for programming fuse options in semiconductor devices.

BACKGROUND OF THE INVENTION

Those of ordinary skill in the field of semiconductor devices will be familiar with many different types of such devices, including, for example, microprocessors and various types of memory devices, such as dynamic random-access memory devices ("DRAMs"), synchronous DRAMs ("SDRAMS"), static random-access memory devices ("SRAMS") capable of storing millions of bits of digital information.

Those of ordinary skill in the art will be familiar with the practice of designing and implementing semiconductor devices which are capable of being permanently programmed during the fabrication process to exhibit different operational properties depending upon a selection process performed at some point during manufacture or testing of the device. Such a practice is common in connection with the design and manufacture of semiconductor memory devices. For example, it is common for a semiconductor memory device to be designed such that during or after the fabrication process, the manufacturer has the option of selecting one of a plurality of input/output (I/O) configurations for the device. A memory device having a (nominally) 64 megabit capacity may be configured to have one of several I/O configurations: either a 16 megabit-by-four-bit ("×4") I/O configuration, where each row and column address pair references four bits at a time, or a 8 megabit-by-eight-bit ("×8") I/O configuration, where each row and column address pair references eight bits at a time, or a 4 megabit-by-sixteen-bit ("×16") configuration, where each row and column address pair references sixteen bits at a time. The selection of either the ×4, ×8, or the ×16 I/O option commonly involves the actuation ("blowing") of one or more one-time-programmable devices on the semiconductor device. Once the appropriate programmable devices are actuated, the device thereafter will permanently operate in accordance with the selected I/O configuration.

So-called "antifuses" are often used as the one-time programmable devices in an integrated circuit product as a mechanism for changing the operating mode of the product. That is, anti-fuses are often used for the purpose of permitting the selection from among a plurality of programmable options for a semiconductor device. As those of ordinary skill in the art will appreciate, antifuses are essentially one-time programmable switching devices whose conductivity state (conductive or non-conductive) can be altered through application of predetermined programming signals to an integrated circuit's I/O pins. Most commonly, an antifuse is initially (i.e., at the time of fabrication) "open" or non-conductive. If it is desired to actuate or "blow" a particular antifuse to change an operational characteristic of the integrated circuit, predetermined programming signals are applied to the integrated circuit's I/O pins. Once blown, the antifuse is rendered conductive. Further, once blown, it is typically not possible to reverse the programming. That is, once a fuse has been blown, it cannot be un-blown.

Programmable options such as the I/O configuration of a memory device are often referred to as "fuse options" for the device. Those of ordinary skill in the art will appreciate that the I/O configuration of a memory device is but one example of the type of fuse options that may be available for a particular device. Fuse options may be available in connection with many different operational parameters of a semiconductor device, including without limitation the selection of certain internal timing parameters, the availability and activation of redundant rows or columns of memory cells in a memory device, the operational speed of a device, voltage regulation of a device, and so on. Providing a single semiconductor device with one or more fuse options is regarded as desirable, since a single design and fabrication process can be used to manufacture more than one class of end product. This flexibility eliminates the need for separate designs and separate fabrication processes to produce multiple classes of end product. Additionally, fuse options enable the manufacturer to counteract the effects of semiconductor process variations, advantageously increasing fabrication yield and maximizing production of higher-performance parts.

A perceived limitation on the fuse option programmability of an integrated circuit arises from the one-time nature of antifuse programming. That is, once a particular fuse option has been selected to change the operational mode of a given integrated circuit, it is typically not possible to reprogram the integrated circuit back to its original operational mode. This limitation may be undesirable. For example, in some cases it may not be possible to ascertain whether a given operational mode is appropriate for an integrated circuit until the integrated circuit can be observed operating in that mode. However, due to the one-time programmability of antifuses, operational parameters cannot be tentatively selected and subsequently unselected.

Semiconductor devices or circuits for providing reprogrammable option selection in an integrated circuit are known. For example, a floating-gate transistor which can be repeatedly and alternately rendered conductive or non-conductive (i.e., turned on and off) can be used to provide option reprogrammability for an integrated circuit. However, such devices have certain potential disadvantages. Circuits or devices for providing option programmability and reprogrammability can be more difficult to fabricate than antifuses, occupy more area in the integrated circuit, increase the overall power consumption of the integrated circuit, and be more difficult to program than antifuses.

SUMMARY OF THE INVENTION

In view of the foregoing and other considerations, the present invention relates to a method and apparatus for providing at least limited reprogrammability of fuse options using one-time programmable devices such as conventional antifuses.

In one embodiment of the invention, the apparatus includes a plurality of programmable devices each actuable from a first state to a second state, and option circuitry coupled to the plurality of programmable devices to receive a plurality of logic signals reflecting the respective states of the plurality of programmable devices. The option circuitry is responsive to the plurality of logic signals to assert a particular one of a plurality of distinct option signals. The particular option signal is determined based on the particular combination of respective states of the plurality of programmable devices. The semiconductor device is responsive to assertion of each of the plurality of distinct option signals to operate in a distinct one of at least two operational modes. The option circuitry is responsive to at least two distinct combinations of respective states of the plurality of programmable devices to assert the same option signal, such that the semiconductor device can be programmed to operate first in a first of the at least two operational modes, then in a second of the at least two operational modes, and then again in the first of the at least two operational modes.

In another embodiment of the invention, the circuit for selecting one of at least two operational modes for a semiconductor device includes a first programmable device and a second programmable device, both actuable from a first state to a second state. The circuit further includes option circuitry coupled to the first and second programmable devices. The option circuitry is responsive to the first programmable device being in the second state and the second programmable device being in the first state to assert a first option signal. The option circuitry is also responsive to the first and second programmable devices being in the second state to assert a second option signal. Further, the semiconductor device is responsive to assertion of the first option signal to operate in a first mode, distinct from the default mode, and to assertion of the second option signal to operate in the default mode.

In a further embodiment of the invention, the selection circuit further includes a third programmable device coupled to the option circuitry. The third programmable device is actuable from the first state to the second state. The option circuitry is responsive to the first programmable device being in the second state to assert either a third option signal or the second option signal, depending upon the state of the second programmable device. The semiconductor device is responsive to assertion of the third option signal to operate in a second mode, distinct from the default mode and the first mode.

In the various embodiments, the programmable devices may be one-time programmable devices, e.g., conventional antifuses.

In another further embodiment, the circuit comprises a programming circuitry, coupled to the programmable devices and responsive to programming signals applied from external to said semiconductor device to select the respective states of the programmable devices.

BRIEF DESCRIPTION OF THE DRAWINGS

The foregoing and other features and aspects of the subject invention will be best understood with reference to a detailed description of a specific embodiment of the invention, which follows, when read in conjunction with the accompanying drawings, in which.

DETAILED DESCRIPTION OF A SPECIFIC EMBODIMENT OF THE INVENTION

Figure 1:
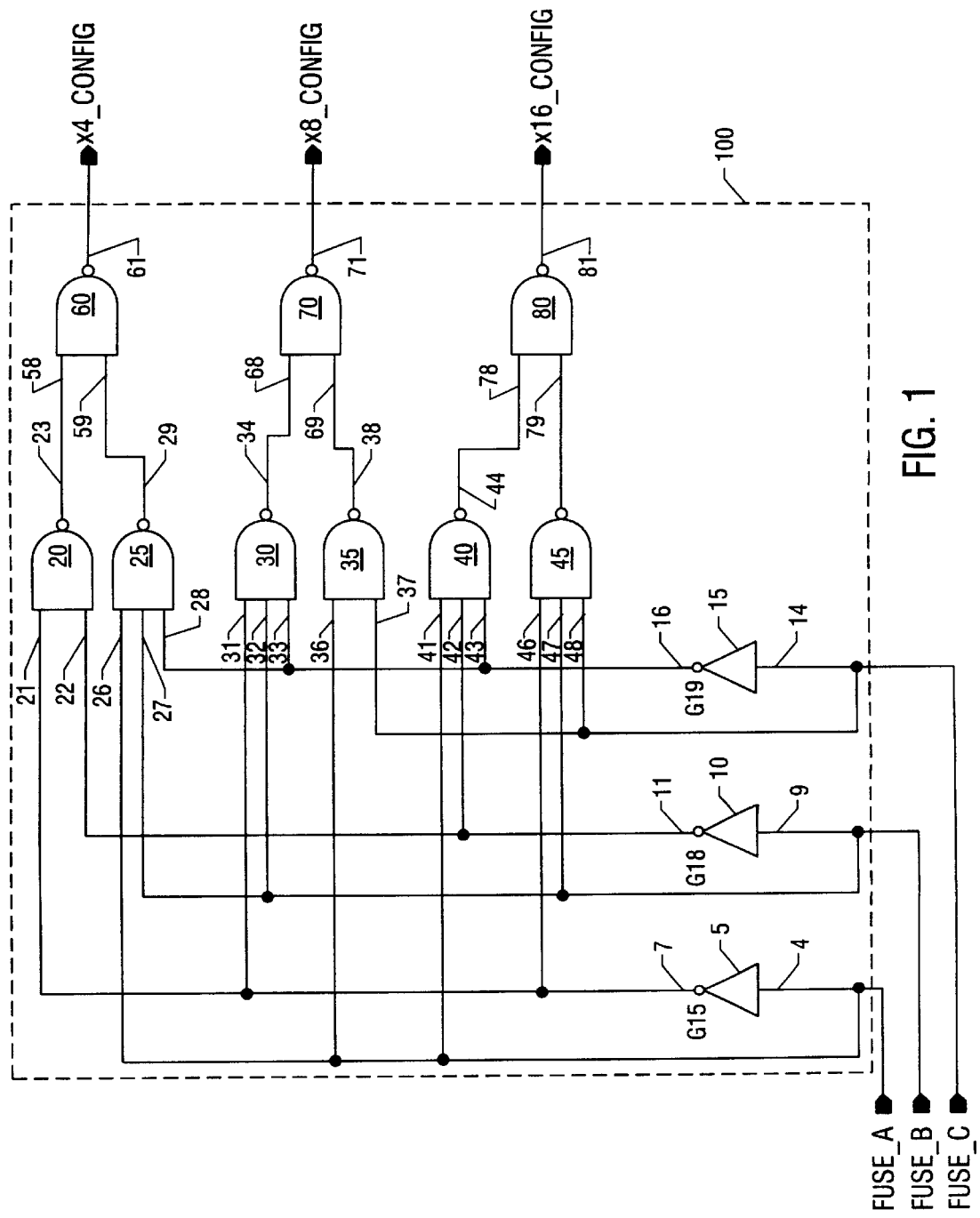
FIG. 1 is schematic diagram of a circuit embodiment in accordance with the present invention.

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system-and business-related constraints), which will vary from one implementation to another. Moreover, attention will necessarily be paid to proper engineering and programming practices for the environment in question. It will be appreciated that such a development effort might be complex and time-consuming, but would nevertheless be a routine undertaking for those of ordinary skill in the semiconductor device technology.

In accordance with one aspect of the present invention, fuse options can be configured to have limited reprogrammability using one-time programmable devices, either with fuses or antifuses. It is well-known that antifuses are capacitive-type structures that, in their unblown states, form open circuits. Antifuses may be "blown" by applying a high voltage across the antifuse. The high voltage causes the capacitive-type structure to break down, forming a conductive path through the antifuse. Once one or more antifuse elements are blown, the semiconductor device will permanently operate in the operational mode in accordance with the blown state of the antifuse.

Each operational parameter of a semiconductor device has its own operational modes. Fuse options are programmed to obtain a particular operational mode by blowing one or more antifuses. The unblown state corresponds to a binary integer "0," and the blown state corresponds to the binary integer "1."

By adding one or more antifuses to the number of antifuses that are normally used to program the fuse options, the fuse options are given the ability to have limited reprogrammability. In other words, by blowing the additional antifuses, the semiconductor device is given the option to remain in the current operational mode, to revert back to its default operational mode, or to switch to another operational mode.

The fuse blowing process may occur during probe or back-end testing. In an embodiment in accordance with the present invention, if one or more antifuse elements are blown to select a particular operational mode for a semiconductor device and the semiconductor device is failing in that mode, the semiconductor device can be salvaged by blowing the additional antifuse to reprogram the fuse option to either revert back to the original operational mode or to another operational mode.

In accordance with another embodiment of the present invention, if one or more antifuse elements are blown in a use-able semiconductor device in an attempt to improve the performance of the semiconductor device by configuring it into another operational mode, e.g., more speed or lower power consumption, and the attempt is unsuccessful, the fuse option can be reprogrammed, by blowing an additional antifuse, to either revert back to the previous mode or to another operational mode.

A fuse option may continue to have reprogrammability so long as that fuse option has an additional antifuse that is yet to be blown. In other words, the process of reprogrammability may continue until all the antifuses are blown.

The limited reprogrammability is made possible by adding one or more antifuses to create multiple states for each operational mode. The multiple states in each operational mode are carefully assigned so as to provide limited reprogrammability to the fuse options.

The number of times a fuse option can be reprogrammed depends on the number of antifuses used and the number of operational modes these antifuses define. As the number of additional antifuses increases, the reprogrammability of the fuse options becomes less limited.

Any fuse option can be designed to have limited reprogrammability in accordance with the present invention. For example, FIG. 1 illustrates an option circuit 100 for an input/output ("I/O") configuration with limited reprogrammability in accordance with an embodiment of the present invention. Circuit 100 in the presently disclosed embodiment is adapted to interface with three antifuse elements, referred to herein as antifuse A, antifuse B, and antifuse C. In particular, as shown in FIG. 1, the output of antifuse A is applied to a terminal designated with reference numeral 4, the output of antifuse B is applied to a terminal designated with reference numeral 9, and the output of antifuse C is applied to a terminal designated with reference numeral 14.

Different configurations of the blown or unblown states of antifuses A, B, and C determine the different generation of signals. Different generation of signals cause option circuit 100 to select different operational modes. For example, if none of the antifuses A, B, or C are blown, then option circuit 100 is configured to generate signals that would cause the circuit 100 to select ×4 (000) configuration as the operational mode for the semiconductor device. On the other hand, if antifuse A is blown, i.e., generating a binary integer 1, and the rest of the antifuses B and C remain in their initial states, i.e., binary integer 0, the option circuit 100 will generate signals that would cause it to select the operational mode ×16 (100).

Option circuit 100 in the presently disclosed embodiment of the invention consists of three inverters 5, 10, 15 which are connected in series with three pairs of NAND gates 20 and 25, 30 and 35 and 40 and 45, in parallel with each other. The outputs from each pair of the NAND gates are applied to the inputs of a third NAND gate, with NAND gates 20 and 25 coupled to NAND gate 60, NAND gates 30 and 35 coupled to NAND gate 70, and NAND gates 40 and 45 coupled to NAND gate 80. The outputs from NAND gates 60, 70, and 80 constitute the outputs from circuit 50, specifying the particular operational modes available, i.e., ×4 configuration, ×8 configuration or ×16 configuration.

Although a specific implementation of option circuit 100 is shown in FIG. 1, this has been done solely for the purposes of illustrating one embodiment of the invention. Those of ordinary skill in the art having the benefit of the present disclosure will readily appreciate that there are essentially an endless number of alternative implementations which might be appropriate depending upon the particular application of the invention (e.g., the number of possible options, the desired extent of reprogrammability, and so on). The present invention is by no means limited to the implementation of NAND gates and inverters depicted in FIG. 1.

The following describes how the NAND gates 20, 25, 30, 35, 40, 45 are connected with the inverters 5, 10 and 15. The first input 21 and the second input 22 of the NAND gate 20 are connected to the output 7 of the inverter 5 and the output 11 of the inverter 10, respectively. The first 26, second 27 and third 28 inputs of the NAND gate 25 are connected to the input of the inverters 5, 10 and the output 16 of inverter 15 respectively. The first input 31, second input 32 and third input 33 of the NAND gate 30 are connected to the output 7 of the inverter 5, the input 9 of the inverter 10, and the output 16 of the inverter 15, respectively. The first input 36 and second input 37 of the NAND gate 35 are connected to the input 4 of the inverter 5 and the input 14 of the inverter 15, respectively. The first input 41, second input 42 and third input 43 of the NAND gate 40 are connected to the input 4 of the inverter 5, the output 11 of the inverter 10 and the output 16 of the inverter 15, respectively. Lastly, the first input 46, second input 47 and third input 48 of the NAND gate 45 are connected to the output 7 of the inverter 5, the input 9 of the inverter 10 and the input 14 of the inverter 15.

Each output of the NAND gates 20 and 25 are connected to the first 58 and second 59 inputs of the NAND gate 60, respectively. Each output of the NAND gates 30 and 35 are connected to the first 68 and second 69 inputs of the NAND gate 70, respectively. Each output of the NAND gates 40 and 45 are connected to the first 78 and second 79 inputs of the NAND gate 80, respectively.

The output 61 of the NAND gate 60, the output 71 of the NAND gate 70 and the output 81 of the NAND gate 80 are connected to ×4 configuration operational mode, ×8 configuration operational mode and ×16 configuration operational mode, respectively.

Figure 2:
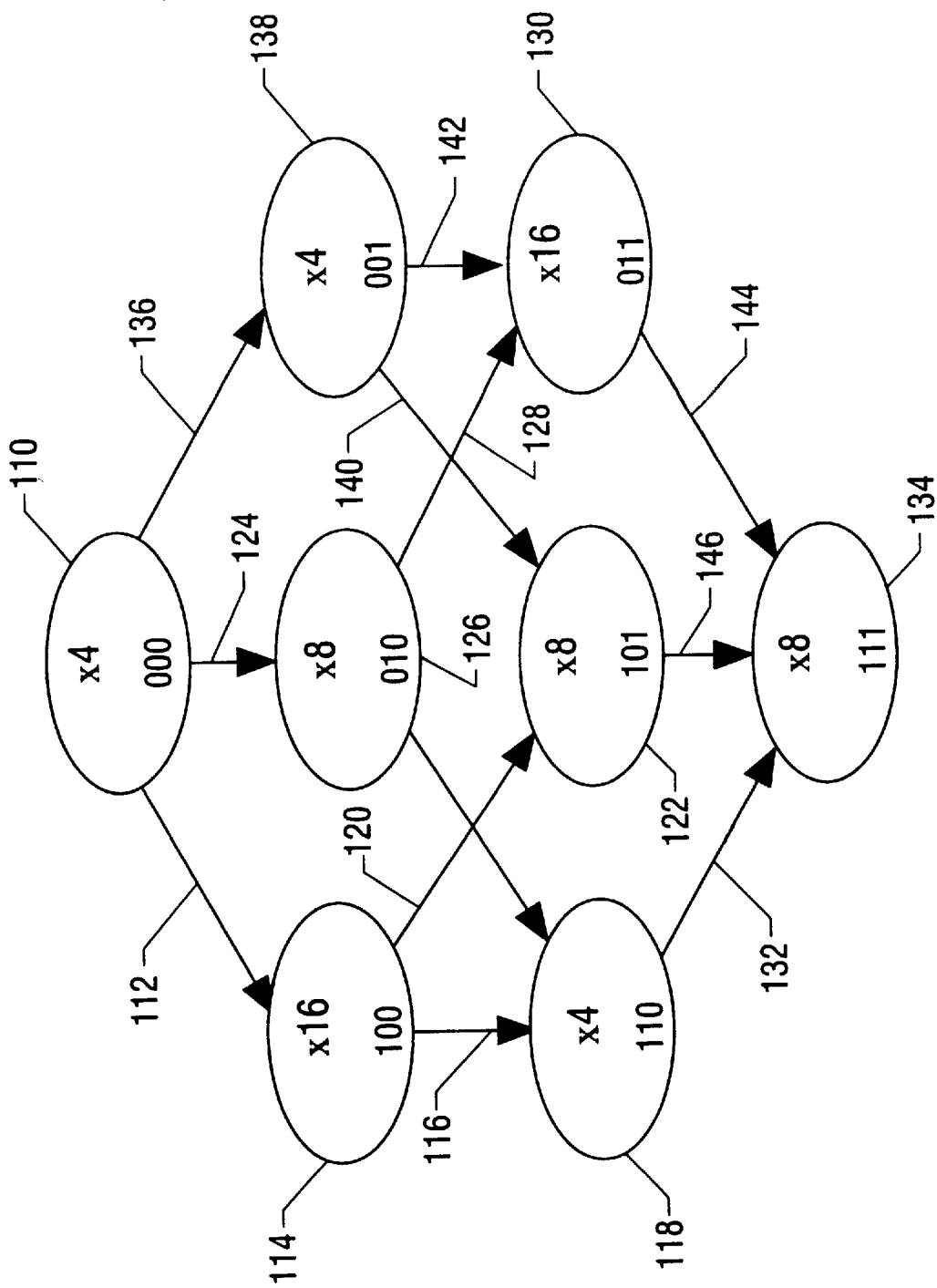
FIG. 2 is a flowchart of the operation of the circuit shown in FIG. 1.

FIG. 2, on the other hand, illustrates a flowchart corresponding to the operation of the circuit 100, which in the presently disclosed embodiment is incorporated into a memory device capable of operating in either ×4, ×8, or ×16 I/O modes. Each node in FIG. 2 represents an operational mode of the I/O configuration. Each operational mode displays an I/O configuration and its representation of multiple states of binary integers. Antifuse A is shown as the left-most binary integer of the configuration, antifuse B as the middle binary integer, and antifuse C as the right-most binary integer.

Initially, when all antifuses A, B and C are in their unblown state, the default operational mode is ×4 configuration (000). This is represented by node 110 in FIG. 2. When it is desired to place the memory device into a ×16 I/O mode, antifuse A is blown. The actuation of antifuse A causes option circuit 100 to generate signals that select the ×16 configuration (100) as the operational mode for the memory device. This is represented by the transition designated with reference numeral 112 in FIG. 2 between node 110 and node 114 However, if after programming the memory device into the ×16 I/O mode by blowing fuse A, it is desired to revert the device back to its original mode, i.e., a ×4 I/O mode, antifuse B can be blown (leaving only fuse C unblown).This causes circuit 100 to select the ×4 configuration (110) as the operational mode, and is reflected by the transition 116 between node 114 and node 118.

On the other hand, if it is desired that the memory device should switch from the ×16 (100) mode of node 114 to a ×8 I/O mode, antifuse C can be blown, which permits the circuit 100 to select ×8 configuration (101) as the operational mode. This is reflected by transition 120 between node 114 and node 122. Thus, in accordance with the present invention, the circuit 100 provides a way for the semiconductor to revert back to its default operational mode or operate in more than one operational mode following its programming out of the default mode.

Similarly, from the default mode of ×4 (000) operation, represented by node 110 in FIG. 2, the memory device may alternatively be programmed directly into a ×8 mode. To accomplish this, antifuse B is blown. This is represented in FIG. 2 by the transition 124 between node 110 and node 126. Thereafter, however, if it is desired that the memory device be programmed to again operate in a ×4 mode, antifuse A can be blown. This corresponds to the transition between node 126 and node 118.

Alternatively, from the ×8 (010) operational mode represented by node 126, if it is desirable for the semiconductor device to operate in a ×16 mode, antifuse C can be blown, as represented by transition 128 between node 126 and node 130. From the ×4 (110) operational mode represented by node 118, if antifuse C is blown, the circuit 100 will select the ×8 (111) operational mode for the semiconductor device. This is represented by the transition 132 between node 118 and node 134.

If antifuse C is the first to be blown while the semiconductor device operates in the default (×4) mode of node 110, the circuit 100 will select ×4 configuration (001) as the operational mode for the semiconductor device. This is represented by the transition 136 from node 110 to node 138. It is to be noted that transition 136 would not commonly be made, since the blowing of only fuse C does not lead to a change in the operational mode of the memory device. However, from node 138 representing the ×4 mode of operation, the circuit 100 can either select either a ×8 (101) mode or a ×16 (011) mode for the semiconductor device. From node 138, if antifuse A is blown, the semiconductor device will operate in a ×8 (101) mode, as represented by the transition 140 from node 138 to node 122. If antifuse B is blown from node 138, the memory device will operate in ×16 (011) mode, as represented by the transition 142 from node 138 to node 130.

Thereafter, if antifuse A is blown while the semiconductor operates in the ×16 (011) mode represented by node 130, the circuit 100 will select ×8 (111) as the operational mode. This is represented by transition 144 from node 130 to node 134.

Finally, if antifuse B is blown from the ×8 (101) configuration mode corresponding to node 122, the circuit 100 will select ×8 (111) as the final operational mode for the semiconductor device. This is represented by transition 146 in FIG. 2 between node 122 and node 134. As with transition 136 between node 110 and node 138, transition 146 would rarely be taken, since no change in the operational mode of the memory device results.

Providing a single semiconductor device with one or more fuse options is regarded as desirable, since a single design and fabrication process can be used to manufacture more than one class of end product. This flexibility eliminates the need for separate designs and separate fabrication processes to produce multiple classes of end product. Additionally, fuse options enable the manufacturer to counteract the effects of semiconductor process variations, advantageously increasing fabrication yield and maximizing production of higher-performance parts. As a result, limited reprogrammability on fuse options ultimately provides the semiconductor device user more control to determine the optimal operational mode for each semiconductor device.

From the foregoing detailed description of a specific embodiment of the invention, it should be apparent that a method and apparatus for providing limited reprogrammability of fuse options in a semiconductor device using one-time programmable antifuse elements has been disclosed. Although a specific embodiment of the invention has been disclosed herein, it is to be understood that this has been done solely for the purposes of illustrating the invention in its various aspects, and is not intended to be limiting with respect to the scope of the invention. It is contemplated that various alterations, substitutions, and/or modifications, including but not limited to those design options and alternatives which may have been specifically noted herein, may be made to the disclosed embodiment without departing from the spirit and scope of the invention as defined in the appended claims, which follow.

In particular, it is to be understood that although the present invention has been described in the context of fuse options for controlling the I/O mode of a semiconductor memory device, the present invention may be equally advantageously practiced for the purposes of any such programmable option for any type of semiconductor device. Likewise, although the disclosed embodiment involved a fuse option for which three possible values are available (×4, ×8, and ×16), it is contemplated that the present invention may be advantageously applied in situations where a greater number of option values are possible. It is believed that those of ordinary skill in the art having the benefit of the present disclosure would have no difficulty whatsoever implementing circuitry in accordance with the present invention for providing such functionality.

What is claimed is:

1. A semiconductor device, comprising:
   operational circuitry capable of operation in at least two different operating modes;
   at least two one-time programmable devices each programmable from a first state to a second state;
   control circuitry, coupled to said at least two one-time programmable devices and to said operational circuitry, said control circuitry being responsive to a first combination of states of said at least two one-time programmable devices to control said operational circuitry to operate in a first of said at least two operating modes;
   said control circuitry being further responsive to a second combination of states of said at least two one-time programmable devices to control said operational circuitry to operate in a second of said at least two operating modes;
   and said control circuitry being further responsive to a third combination of states of said operational circuitry to control said operational circuitry to operate in said first of said at least two operating modes.

2. A semiconductor device in accordance with claim 1, wherein said at least two one-time programmable devices comprise electrically-actuable antifuses.

3. A semiconductor device in accordance with claim 1, further comprising programming circuitry, coupled to said at least two one-time programmable devices and responsive to programming signals applied from external to said semiconductor device to select a combination of states of said at least two one-time programmable devices.

4. A semiconductor device in accordance with claim 1, wherein said control circuitry is further responsive to a fourth combination of states of said at least two one-time programmable devices to control said operational circuitry to operate in said second of said at least two operating modes.

5. A semiconductor device in accordance with claim 4, wherein said at least two one-time programmable devices comprises three one-time programmable devices, and wherein said at least two operating modes comprises three operating modes.

6. A semiconductor device in accordance with claim 5, wherein said three one-time programmable devices comprise antifuses.

7. A semiconductor device in accordance with claim 1, wherein said semiconductor device comprises a semiconductor memory.

8. A semiconductor device in accordance with claim 7, wherein said semiconductor memory is a dynamic random-access memory.

9. A semiconductor device in accordance with claim 7, wherein said at least two operating modes comprise ×n and ×m operating modes, where n and m are the number of bits accessed during a single memory access cycle.

10. A method of testing a semiconductor device capable of operation in at least two different operating modes, comprising:

(a) coupling a plurality of one-time programmable devices, each actuable from a first state to a second state, to an option circuit;

(b) receiving, by said option circuit, a plurality of logic signals reflecting the respective states of said plurality of one-time programmable devices;

(c) asserting a first option signal in response to a first combination of states of said plurality of one-time programmable devices;

(d) operating said semiconductor device in a first of said at least two operating modes in response to assertion of said first option signal;

(e) during said step (d) of operating said semiconductor device in said first operating modes, testing the performance of said semiconductor device;

(f) after said step (e) of testing the performance of said semiconductor device, altering the state of at least one of said plurality of one-time programmable devices;

(g) deasserting said first option signal and asserting a second option signal in response to said alteration of the state of said at least one of said plurality of one-time programmable devices;

(h) operating said semiconductor device in a second operating mode in response to assertion of said second option signal;

(i) during said step (h) of operating said semiconductor device in said second operating mode, testing the performance of said semiconductor device;

(j) after said step (i) of testing the performance of said semiconductor device, altering the state of at least one of said plurality of one-time programmable devices;

(k) deasserting said second option signal and asserting said first option signal in response to said step (j) of altering the state of at least one of said plurality of one-time programmable devices;

(l) operating said semiconductor device in said first operating mode in response to assertion of said first option signal.

11. A method in accordance with claim 10, wherein said steps (f) and (i) of altering the state of at least one of said plurality of one-time programmable devices comprise rendering an antifuse element conductive.

12. A method in accordance with claim 10, wherein said semiconductor device is a semiconductor memory device.

13. A method in accordance with claim 12, wherein said steps (d) and (l) of operating said device in said first operating mode comprises operating said semiconductor memory device in a ×m operating mode, where m is the number of bits accessed during each memory access cycle.

14. A method in accordance with claim 13, wherein said step (h) of operating said semiconductor device in said second mode comprises operating said semiconductor memory device in a ×n operating mode, where n is the number of bits accessed during each memory access cycle and n>m.

15. A semiconductor device operable in at least two different operating modes, comprising:

a plurality of one-time programmable devices each programmable from a first state to a second state;

a control circuit responsive to different combinations of states of said plurality of one-time programmable devices to assert respective different ones of a plurality of option signals;

operational circuitry, responsive to selective assertion of different ones of said plurality of option signals to operate in respectively different operating modes;

wherein said control circuit is responsive to at least two different combinations of states of said one-time programmable devices to assert the same option signal.

16. A semiconductor device in accordance with claim 15, wherein said one-time programmable devices comprise antifuses.

17. A semiconductor device in accordance with claim 15, wherein said semiconductor device is a semiconductor memory device.

18. A semiconductor device in accordance with claim 17, wherein said semiconductor memory device is a dynamic random-access memory device.

* * * * *